United States Patent
Uchida

(10) Patent No.: US 11,795,346 B2
(45) Date of Patent: Oct. 24, 2023

(54) POLISHING LIQUID COMPOSITION FOR SILICON OXIDE FILM

(71) Applicant: KAO CORPORATION, Tokyo (JP)

(72) Inventor: Yohei Uchida, Wakayama (JP)

(73) Assignee: KAO CORPORATION, Tokyo (JP)

(*) Notice: Subject to any disclaimer, the term of this patent is extended or adjusted under 35 U.S.C. 154(b) by 85 days.

(21) Appl. No.: 16/958,640

(22) PCT Filed: Dec. 21, 2018

(86) PCT No.: PCT/JP2018/047344
§ 371 (c)(1),
(2) Date: Jun. 26, 2020

(87) PCT Pub. No.: WO2019/131545
PCT Pub. Date: Jul. 4, 2019

(65) Prior Publication Data
US 2020/0369919 A1    Nov. 26, 2020

(30) Foreign Application Priority Data

Dec. 28, 2017    (JP) ................. 2017-253993

(51) Int. Cl.
*C09G 1/02* (2006.01)
*B24B 37/04* (2012.01)
*H01L 21/3105* (2006.01)

(52) U.S. Cl.
CPC .............. *C09G 1/02* (2013.01); *B24B 37/044* (2013.01); *H01L 21/31053* (2013.01)

(58) Field of Classification Search
CPC .... C09G 1/02; H01L 21/31053; B24B 37/044
See application file for complete search history.

(56) References Cited

U.S. PATENT DOCUMENTS

| | | | |
|---|---|---|---|
| 2006/0110924 A1 | 5/2006 | Ghosh et al. | |
| 2007/0219104 A1 | 9/2007 | Grumbine et al. | |
| 2008/0003925 A1 | 1/2008 | Fukasawa et al. | |
| 2009/0047786 A1* | 2/2009 | Fukasawa | C09K 3/1409 438/693 |
| 2009/0202816 A1* | 8/2009 | Schlenoff | C09K 3/1409 977/773 |
| 2009/0215266 A1 | 8/2009 | Thomas et al. | |
| 2018/0265372 A1* | 9/2018 | Yao | C01G 25/02 |

FOREIGN PATENT DOCUMENTS

| | | |
|---|---|---|
| CN | 101375376 A | 2/2009 |
| CN | 101437912 A | 5/2009 |
| CN | 102585765 A | 7/2012 |
| JP | 2000-109810 A | 4/2000 |
| JP | 2003-158101 A | 5/2003 |
| JP | 2004-297035 A | 10/2004 |
| JP | 2006-165541 A | 6/2006 |
| JP | 2007-103485 A | 4/2007 |
| JP | 2009-200496 A | 9/2009 |
| JP | 2009-260236 A | 11/2009 |
| JP | 2010-272733 A | 12/2010 |
| JP | 2012-503880 A | 2/2012 |
| JP | 2015-195391 A | 11/2015 |
| JP | 2016-20294 A | 2/2016 |
| JP | 2016-127268 A | 7/2016 |
| JP | 2017-190381 A | 10/2017 |
| WO | WO 2010/036358 A1 | 4/2010 |

OTHER PUBLICATIONS

Sigma Aldrich, "2-Methacryloyloxyethyl phosphorylcholine" via https://www.sigmaaldrich.com/US/en/product/aldrich/730114?gclid=EAIaIQobChMIu9WKsKTG-AIVmITICh0mAQXmEAAYASAAEgKBZPD_BWE; pp. 1-8 (Year: 2022).*

Chemical Book, "Lauryl Betaine" via https://www.chemicalbook.com/ChemicalProductProperty_EN_CB7426492.htm; pp. 1-2 (Year: 2022).*

ALFA Chemistry, "Stearyl Betaine" via https://surfactant.alfa-chemistry.com/product/stearyl-betaine-cas-820-66-6-319619.html?gclid=EAIaIQobChMI_9nV9trG-AIVIc3ICh1wWAbEEAMYASAAEgJ8NPD_BWE; pp. 1-2 (Year: 2022).*

Chinese Office Action and Search Report, dated Apr. 16, 2021, for Chinese Application No. 201880083779.4. with English machine translation of the Chinese Office Action.

International Search Report, issued in PCT/JP2018/047344, PCT/ISA/210, dated Feb. 26, 2019.

* cited by examiner

Primary Examiner — Binh X Tran

(74) Attorney, Agent, or Firm — Birch, Stewart, Kolasch & Birch, LLP

(57) ABSTRACT

A polishing liquid composition for a silicon oxide film according to the present invention includes cerium oxide particles, a water-soluble macromolecular compound, and an aqueous medium, and the water-soluble macromolecular compound is a water-soluble macromolecular compound including a betaine structure, excluding carbobetaine homopolymers and sulfobetaine homopolymers. The water-soluble macromolecular compound is preferably a water-soluble macromolecular compound containing a constitutional unit A including a betaine structure, and a constitutional unit B that is a constitutional unit other than the constitutional unit A and contains at least one group of a primary amino group, a secondary amino group, a tertiary amino group, a quaternary ammonium group, and salts thereof.

15 Claims, No Drawings

POLISHING LIQUID COMPOSITION FOR SILICON OXIDE FILM

TECHNICAL FIELD

The present invention relates to a polishing liquid composition for a silicon oxide film, a polishing kit and an additive composition for silicon oxide film polishing for preparing the same, and a method for manufacturing a semiconductor device and a method for polishing an uneven stepped surface in which the polishing liquid composition for a silicon oxide film is used.

BACKGROUND ART

A chemical-mechanical polishing (CMP) technique is a technique for smoothing the surface of a polishing-target substrate by removing uneven portions on the surface thereof through a chemical reaction and a mechanical process, and is performed as follows: the surface of a polishing-target substrate to be processed is brought into contact with a polishing pad, and, in this state, the polishing-target substrate and the polishing pad are moved relative to each other while a polishing liquid composition is supplied to the contact portion where the polishing-target substrate and the polishing pad are in contact with each other.

Nowadays, this CMP technique is essential for smoothing an interlayer insulating film, formation of a shallow trench element isolation structure (also referred to as "element isolation structure" hereinafter), formation of a plugged and embedded metal wiring, and the like in a semiconductor element manufacturing process. In recent years, multilayering and miniaturization of semiconductor elements have dramatically advanced, and achievement of both more favorable flatness and high-speed polishing is desired.

Patent Document 1 discloses a polishing agent for CMP containing a specific compound having a betaine structure or a polymer of the compound having a betaine structure for the purpose of ensuring high silicon oxide film polishing speed and mitigating scratches. Patent Document 2 discloses a CMP composition that is suitable for polishing of a metal component such as tungsten and contains an amino compound such as a quaternary ammonium compound (e.g., a quaternary ammonium-substituted polymer).

CITATION LIST

Patent Documents

Patent Document 1: JP 2009-260236A
Patent Document 2: JP 2015-195391A

DISCLOSURE OF INVENTION

Problem to be Solved by the Invention

However, it is desired to provide a polishing agent composition with which a silicon oxide film can be polished at a higher speed compared with a case where a conventional polishing liquid composition for a silicon oxide film disclosed in Patent Document 1 and the like is used.

The present invention provides a polishing liquid composition for a silicon oxide film with which a silicon oxide film can be polished at a high speed, a polishing kit and an additive composition for silicon oxide film polishing for preparing the same, and a method for manufacturing a semiconductor device and a method for polishing an uneven stepped surface in which the polishing liquid composition for a silicon oxide film is used.

Means for Solving Problem

A polishing liquid composition for a silicon oxide film according to the present invention relates to a polishing liquid composition for a silicon oxide film including cerium oxide particles, a water-soluble macromolecular compound, and an aqueous medium, wherein the water-soluble macromolecular compound is a water-soluble macromolecular compound including a betaine structure, excluding carbobetaine homopolymers and sulfobetaine homopolymers.

A polishing liquid kit for preparing a polishing liquid composition for a silicon oxide film according to the present invention relates to a polishing liquid kit including:
   a first liquid obtained by dispersing cerium oxide particles in an aqueous medium; and
   a second liquid that is contained in a container separate from a container containing the first liquid and contains an aqueous medium,
   wherein one or both of the first liquid and the second liquid further contains a water-soluble macromolecular compound, and
   the water-soluble macromolecular compound is a water-soluble macromolecular compound including a betaine structure, excluding carbobetaine homopolymers and sulfobetaine homopolymers.

An additive composition for silicon oxide film polishing according to the present invention relates to an additive composition for silicon oxide film polishing to be used together with a dispersion liquid obtained by dispersing cerium oxide particles in an aqueous medium, including:
   an aqueous medium; and
   a water-soluble macromolecular compound dissolved in the aqueous medium,
   wherein the water-soluble macromolecular compound is a water-soluble macromolecular compound including a betaine structure, excluding carbobetaine homopolymers and sulfobetaine homopolymers.

A method for manufacturing a semiconductor device according to the present invention includes a step of polishing a silicon oxide film using the polishing liquid composition for a silicon oxide film according to the present invention.

A method for polishing a silicon oxide film according to the present invention includes a step of polishing a silicon oxide film using the polishing liquid composition for a silicon oxide film according to the present invention, wherein the silicon oxide film is an insulating film formed in a process for manufacturing a semiconductor device.

Effects of the Invention

When a silicon oxide film is polished using the polishing liquid composition for a silicon oxide film according to the present invention, the polishing kit, or the polishing liquid composition for a silicon oxide film according to the present invention prepared using the additive composition for silicon oxide film polishing, the silicon oxide film can be polished at a high speed. Accordingly, the method for manufacturing a semiconductor device and the method for polishing a silicon oxide film in which the polishing liquid composition for a silicon oxide film according to the present invention is used may contribute to an improvement in the productivity of a semiconductor device.

DESCRIPTION OF THE INVENTION

An aspect of the present invention is a polishing liquid composition for a silicon oxide film including cerium oxide particles, a water-soluble macromolecular compound, and an aqueous medium, wherein the water-soluble macromolecular compound is a water-soluble macromolecular compound including a betaine structure, excluding carbobetaine homopolymers and sulfobetaine homopolymers. When a silicon oxide film is polished using the polishing liquid composition for a silicon oxide film according to the present invention (which may also be abbreviated as "polishing liquid composition according to the present invention" hereinafter), the silicon oxide film can be polished at a high speed.

In the present application, the betaine structure refers to a structure in which a positive charge and a negative charge are present in the same molecule and are neutralized. In the above-mentioned betaine structure, the positive charge and the negative charge are preferably located at positions that are not adjacent to each other, and it is preferable that one or more atoms are present therebetween. The carbobetaine homopolymer refers to a homopolymer containing a constitutional unit including a carbobetaine structure, and the carbobetaine structure refers to a betaine structure in which a negative charge is derived from a dissociated carboxy group. The sulfobetaine homopolymer refers to a homopolymer containing a constitutional unit including a sulfobetaine structure, and the sulfobetaine structure refers to a betaine structure in which a negative charge is derived from a dissociated sulfonic group.

Cerium Oxide Particles

The polishing liquid composition according to the present invention contains cerium oxide particles ($CeO_2$ particles) as polishing abrasive particles. There is no particular limitation on the method for manufacturing the cerium oxide particles. And pulverized cerium oxide obtained by firing and pulverizing a cerium compound produced through wet synthesis, colloidal cerium oxide obtained through a build-up process such as a sol-gel process, and the like can be used as the above-mentioned cerium oxide particles. In the present invention, composite oxide particles containing cerium oxide as a main component, and the like may be used as the cerium oxide particles.

The content of the cerium oxide particles contained in the polishing liquid composition according to the present invention is preferably 0.01 mass % or more, more preferably 0.05 mass % or more, even more preferably 0.1 mass % or more, even more preferably 0.15 mass % or more, and even more preferably 0.2 mass % or more, from the viewpoint of improving the silicon oxide film polishing speed, and is preferably 10 mass % or less, more preferably 8 mass % or less, even more preferably 7 mass % or less, even more preferably 6 mass % or less, and even more preferably 5 mass % or less, from the viewpoint of inhibiting the occurrence of polishing flaws.

The average primary particle diameter of the cerium oxide particles is preferably 5 nm or more, more preferably 10 nm or more, and even more preferably 15 nm or more, from the viewpoint of improving the silicon oxide film polishing speed, and is preferably 300 nm or less, more preferably 250 nm or less, and even more preferably 200 nm or less, from the viewpoint of inhibiting the occurrence of polishing flaws.

Here, the average primary particle diameter (nm) means a particle diameter (on a spherical shape basis) calculated based on the equation below using a specific surface area S ($m^2/g$) calculated using a BET (nitrogen adsorption) method.

Average primary particle diameter (nm)=$820/S$

The average crystallite diameter of the cerium oxide particles contained in the polishing liquid composition according to the present invention is preferably 5 nm or more, more preferably 10 nm or more, and even more preferably 15 nm or more, from the viewpoint of ensuring the silicon oxide film polishing speed, and is preferably 100 nm or less, more preferably 80 nm or less, and even more preferably 50 nm or less, from the viewpoint of inhibiting the occurrence of polishing flaws.

The volume based average particle size (D50) of the cerium oxide particles contained in the polishing liquid composition according to the present invention is preferably 10 nm or more, more preferably 20 nm or more, even more preferably 30 nm or more, and even more preferably 50 nm or more, from the viewpoint of improving the polishing speed, and is preferably 500 nm or less, more preferably 400 nm or less, and even more preferably 300 nm or less, from the viewpoint of inhibiting the occurrence of polishing flaws.

Here, the volume based average particle size (D50) means the particle diameter at which the cumulative volume frequency calculated in volume percentage in ascending order from small to large particle diameters reaches 50%. The volume based average particle size (D50) is determined through measurement performed using a laser diffraction/scattering particle size distribution analyzer (e.g., "LA-920" (product name) manufactured by HORIBA, Ltd.).

Water-Soluble Macromolecular Compound Including Betaine Structure

The polishing liquid composition according to the present invention contains a water-soluble macromolecular compound including a betaine structure (excluding carbobetaine homopolymers and sulfobetaine homopolymers) (which may also be abbreviated as "macromolecule X" hereinafter) from the viewpoint of improving the polishing speed. Here the term "water-soluble" refers to having a solubility of 2 g/100 mL or more in water (20° C.). From the viewpoint of improving the polishing speed, examples of the macromolecule X include homopolymers containing a constitutional unit including a betaine structure (excluding carbobetaine homopolymers and sulfobetaine homopolymers) and copolymers containing a constitutional unit including a betaine structure. And homopolymers or copolymers containing a constitutional unit A below are preferable.

Constitutional Unit A

The macromolecule X preferably contains a constitutional unit represented by Formula (1) below as the constitutional unit A from the viewpoint of improving the polishing speed. The constitutional unit A is a constitutional unit derived from an unsaturated monomer containing a betaine group, for example.

Chemical Formula 1

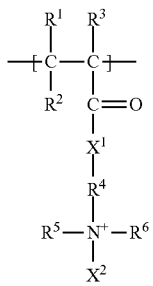

(1)

In Formula (1) above,
$R^1$ to $R^3$ are the same as or different from each other and represent a hydrogen atom, a methyl group, or an ethyl group,
$R^4$ represents an alkylene group having 1 to 4 carbon atoms or $-Y^1-OPO_3^--Y^2-$,
$Y^1$ and $Y^2$ are the same as or different from each other and represent an alkylene group having 1 to 4 carbon atoms,
$R^5$ and $R^6$ are the same as or different from each other and represent a hydrocarbon group having 1 to 4 carbon atoms,
$X^1$ represents O or $NR^7$,
$R^7$ represents a hydrogen atom or a hydrocarbon group having 1 to 4 carbon atoms,
$X^2$ represents a hydrocarbon group having 1 to 4 carbon atoms, $-R^{17}SO_3^-$, or $-R^{18}COO^-$, and
$R^{17}$ and $R^{18}$ are the same as or different from each other and represent an alkylene group having 1 to 4 carbon atoms.

It should be noted that, when $R^4$ is an alkylene group having 1 to 4 carbon atoms, $X^2$ is $-R^{17}SO_3^-$ or $-R^{18}COO^-$, and when $R^4$ is $-Y^1-OPO_3^--Y^2-$, $X^2$ is a hydrocarbon group having 1 to 4 carbon atoms.

$R^1$ and $R^2$ are preferably hydrogen atoms from the viewpoint of the availability of the unsaturated monomer, the polymerizability of the monomer, and improving the polishing speed.

$R^3$ is preferably a hydrogen atom or a methyl group, and more preferably a methyl group, from the viewpoint of the availability of the unsaturated monomer, the polymerizability of the monomer, and improving the polishing speed.

$X^1$ is preferably O (oxygen atom) from the viewpoint of the availability of the unsaturated monomer, the polymerizability of the monomer, and improving the polishing speed.

$R^4$ is preferably an alkylene group having 2 or 3 carbon atoms or $-Y^1-OPO_3^--Y^2-$, more preferably an alkylene group having 2 carbon atoms or $-Y^1-OPO_3^--Y^2-$, and even more preferably $-Y^1-OPO_3^--Y^2-$, from the viewpoint of improving the polishing speed, and is preferably an alkylene group having 2 carbon atoms from the viewpoint of the availability of the unsaturated monomer and the polymerizability of the monomer.

$Y^1$ and $Y^2$ are individually preferably an alkylene group having 2 or 3 carbon atoms, and more preferably an alkylene group having 2 carbon atoms, from the viewpoint of the availability of the unsaturated monomer, the polymerizability of the monomer, and improving the polishing speed.

$R^5$ and $R^6$ are individually preferably a methyl group or an ethyl group, and more preferably a methyl group, from the viewpoint of the availability of the unsaturated monomer, the polymerizability of the monomer, and improving the polishing speed.

When $R^4$ is an alkylene group having 1 to 4 carbon atoms, $X^2$ is $-R^{17}SO_3^-$ or $-R^{18}COO^-$, and is preferably $-R^{18}COO^-$ from the viewpoint of improving the polishing speed. When $R^4$ is $-Y^1-OPO_3^--Y^2-$, $X^2$ is a hydrocarbon group having 1 to 4 carbon atoms, and is more preferably a methyl group from the viewpoint of improving the polishing speed.

The number of carbon atoms in $R^{17}$ is preferably 1 or more and 3 or less, and more preferably 2 or more and 3 or less, from the viewpoint of the availability of the unsaturated monomer, the polymerizability of the monomer, and improving the polishing speed. The number of carbon atoms in $R^{18}$ is preferably 1 or more and 3 or less, and more preferably 1 or more and 2 or less, from the viewpoint of the availability of the unsaturated monomer, the polymerizability of the monomer, and improving the polishing speed.

The betaine structure included in the constitutional unit A is preferably a sulfobetaine structure, a carbobetaine structure, or a phosphobetaine structure, more preferably a carbobetaine structure or a phosphobetaine structure, and even more preferably a phosphobetaine structure, from the viewpoint of improving the polishing speed. It should be noted that the phosphobetaine structure refers to a betaine structure in which a negative charge is derived from a dissociated phosphate group, and the sulfobetaine structure and the carbobetaine structure are as mentioned above.

The constitutional unit A is preferably a constitutional unit derived from preferably at least one monomer selected from sulfobetaine methacrylate, methacryloyloxyethyl phosphorylcholine, and carboxybetaine methacrylate, more preferably a constitutional unit derived from at least one monomer selected from methacryloyloxyethyl phosphorylcholine and carboxybetaine methacrylate, and even more preferably a constitutional unit derived from methacryloyloxyethyl phosphorylcholine, from the viewpoint of improving the polishing speed.

Constitutional Unit B

When the macromolecule X is a copolymer that further contains a constitutional unit B in addition to the constitutional unit A, the constitutional unit B is preferably a constitutional unit that is cationic in the polishing liquid composition and contains at least one group of a primary amino group, a secondary amino group, a tertiary amino group, a quaternary ammonium group, and salts thereof from the viewpoint of improving the polishing speed. A nitrogen atom included in these groups is preferably adjacent to a carbon atom of an alkylene group (it should be noted that a hydrogen atom of the alkylene group is optionally substituted by a hydroxy group), and more preferably adjacent to a carbon atom of an alkylene group having 2 or more carbon atoms (it should be noted that a hydrogen atom of the alkylene group is optionally substituted by a hydroxy group). The constitutional unit B contains at least one group of a secondary amino group, a tertiary amino group, a quaternary ammonium group, and salts thereof, and more preferably at least one group of a quaternary ammonium group and salts thereof, from the viewpoint of improving the polishing speed. It is inferred that, in the case where the macromolecule X is a copolymer containing the constitutional unit A including a betaine structure and the constitutional unit B that is cationic in the polishing liquid composition, the silicon oxide film polishing speed is improved because the constitutional unit A contributes to the hydrophilization of the silicon oxide film and thus the cerium oxide particles are efficiently supplied to the surface of a silicon oxide film, while the constitutional unit B promotes the adsorption of the macromolecule X to the negatively-charged silicon oxide film and thus the hydrophilization of the silicon oxide film.

The constitutional unit B is preferably a constitutional unit represented by Formula (2) below, for example, from the viewpoint of improving the polishing speed.

Chemical Formula 2

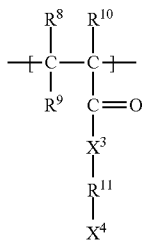

(2)

It should be noted that, in Formula (2), $R^8$ to $R^{10}$ are the same as or different from each other and represent a hydrogen atom, a methyl group, or an ethyl group, $X^3$ represents O or $NR^{19}$, $R^{19}$ represents a hydrogen atom or a hydrocarbon group having 1 to 4 carbon atoms, $R^{11}$ represents an alkylene group having 1 to 22 carbon atoms, where a hydrogen atom of the alkylene group is optionally substituted by a hydroxy group, $X^4$ represents $N^+R^{12}R^{13}R^{14}$ or $NR^{15}R^{16}$, $R^{12}$ to $R^{14}$ are the same as or different from each other and represent a hydrocarbon group having 1 to 4 carbon atoms, and $R^{15}$ and $R^{16}$ are the same as or different from each other and represent a hydrogen atom or a hydrocarbon group having 1 to 4 carbon atoms.

$R^8$ and $R^9$ are preferably hydrogen atoms from the viewpoint of the availability of the unsaturated monomer, the polymerizability of the monomer, and improving the polishing speed.

$R^{19}$ is preferably a hydrogen atom or a methyl group, and more preferably a methyl group, from the viewpoint of the availability of the unsaturated monomer, the polymerizability of the monomer, and improving the polishing speed.

$X^3$ is preferably O from the viewpoint of the availability of the unsaturated monomer, the polymerizability of the monomer, and improving the polishing speed.

$X^4$ is preferably $N^+R^{12}R^{13}R^{14}$ from the viewpoint of the availability of the unsaturated monomer, the polymerizability of the monomer, and improving the polishing speed, and $R^{12}$ to $R^{14}$ are the same as or different from each other and are individually preferably a methyl group or an ethyl group, and more preferably a methyl group, from the same viewpoint. The constitutional unit B may be in the form of a neutralized salt. Examples of a counter ion include a halogen ion such as a chloride ion, a methylsulfate ion, and an ethylsulfate ion, and a chloride ion is preferable from the viewpoint of availability.

$R^{11}$ is preferably an alkylene group having 1 to 22 carbon atoms (it should be noted that a hydrogen atom of the hydrocarbon group is optionally substituted by a hydroxy group) from the viewpoint of the availability of the unsaturated monomer, the polymerizability of the monomer, and improving the polishing speed, and the number of carbon atoms in the alkylene group is preferably 2 or more or preferably 3 or less, and more preferably 3, from the same viewpoint.

The constitutional unit B is preferably a constitutional unit derived from at least one monomer selected from an unsaturated monomer having an amino group such as a methacrylate having a primary amine, secondary amine, or tertiary amine in its structure, an unsaturated monomer having a cationic group such as a methacrylate having a quaternary ammonium cation in its structure, methacryloyloxyethyldimethylethyl aminium (MOEDES), 2-hydroxy-3-(trimethylaminio)propyl methacrylate (THMPA), methacryloylethyltrimethyl aminium (MOETMA), 2-aminoethyl methacrylate (MOEA), and 2-(diethylamino)ethyl methacrylate (MOEDEA), more preferably a constitutional unit derived from at least one monomer selected from THMPA, MOEA, and MOEDEA, and even more preferably a constitutional unit derived from THMPA, from the viewpoint of the availability of the unsaturated monomer, the polymerizability of the monomer, and improving the polishing speed.

Molar Ratio between Constitutional Unit B and Constitutional Unit A

The molar ratio between the constitutional unit B and the constitutional unit A (constitutional unit B/constitutional unit A) in the macromolecule X is preferably 90/10 or less, more preferably 70/30 or less, and even more preferably 40/60 or less, from the viewpoint of improving the polishing speed, and is preferably 5/95 or more, and more preferably 15/85 or more, from the same viewpoint.

Constitutional Unit Other Than Constitutional Unit A and Constitutional Unit B

The macromolecule X may contain a constitutional unit other than the constitutional unit A and the constitutional unit B as long as the effects of the present invention are not impaired. The constitutional unit other than the constitutional unit A and the constitutional unit B is preferably a constitutional unit derived from a hydrophobic unsaturated monomer such as styrene.

The total content of the constitutional unit A and the constitutional unit B in the macromolecule X is preferably 99 mass % or more, more preferably 99.5 mass % or more, even more preferably 99.9 mass % or more, and even more preferably 99.95 mass % or more, and may be 100 mass %.

Weight Average Molecular Weight of Macromolecule X

The weight average molecular weight of the macromolecule X is preferably 1,000 or more, more preferably 5,000 or more, and even more preferably 10,000 or more, from the viewpoint of improving the polishing speed, and is preferably 3,000,000 or less, more preferably 2,000,000 or less, and even more preferably 1,000,000 or less, from the same viewpoint. It should be noted that the weight average molecular weight of the macromolecule X can be measured using a method described in Examples.

Content of Macromolecule X

The content of the macromolecule X in the polishing liquid composition is preferably 0.0005 mass % or more, more preferably 0.001 mass % or more, even more preferably 0.002 mass % or more, even more preferably 0.003 mass % or more, and even more preferably 0.005 mass % or more, from the viewpoint of improving the polishing speed, and is preferably 1.0 mass % or less, more preferably 0.7 mass % or less, even more preferably 0.4 mass % or less, even more preferably 0.2 mass % or less, and even more preferably 0.08 mass % or less, from the same viewpoint.

The mass ratio between the cerium oxide particles and the macromolecule X (cerium oxide particles/macromolecule X) in the polishing liquid composition is preferably 0.1 or more, more preferably 1.0 or more, and even more preferably 5.0 or more, from the viewpoint of improving the polishing speed, and is preferably 500 or less, more preferably 200 or less, and even more preferably 80 or less, from the same viewpoint.

Aqueous Medium

The polishing liquid composition according to the present invention contains an aqueous medium as a medium. Examples of the aqueous medium include water, and a mixture of water and a water-soluble solvent. Examples of the water-soluble solvent include alcohols such as methanol, ethanol, and isopropanol, and ethanol is preferable from the viewpoint of improving safety during silicon oxide film polishing. The aqueous medium is more preferably water such as ion-exchanged water, distilled water, or ultrapure water from the viewpoint of improving the quality of a semiconductor device, improving the handleability of the polishing liquid composition due to low volatility, and improving safety during silicon oxide film polishing.

The content of the aqueous medium in the polishing liquid composition according to the present invention can be set as the content of the remaining portion excluding the cerium oxide particles, the macromolecule X, and optional components below.

Optional Component

The polishing liquid composition according to the present invention can contain other components as long as the effect of increasing the polishing speed is not impaired. Examples of the other components include a pH adjuster, a polishing auxiliary agent other than the macromolecule X, a silicon nitride polishing inhibitor, a thickener, a dispersant, a corrosion inhibitor, a basic substance, and a surfactant. The content of these optional components is preferably 0.001 mass % or more, more preferably 0.0025 mass % or more, and even more preferably 0.01 mass % or more, and is preferably 5 mass % or less, more preferably 3 mass % or less, and even more preferably 2 mass % or less, from the viewpoint of ensuring the polishing speed.

Examples of the pH adjuster include acidic compounds, alkaline compounds, and salts thereof. The type of the salts of the acidic compounds is preferably at least one selected from an alkaline metal salt, an ammonium salt, and an amine salt, and more preferably an ammonium salt. In the case where the basic compounds are in the form of a salt, the counter ion is preferably at least one selected from a hydroxide ion, a chloride ion, and an iodide ion, and more preferably at least one selected from a hydroxide ion and a chloride ion.

Examples of the acidic compounds include inorganic acids such as hydrochloric acid, nitric acid, and sulfuric acid; and organic acids such as acetic acid, oxalic acid, citric acid, and malic acid. Of these, at least one selected from hydrochloric acid, nitric acid, and acetic acid is preferable, and at least one selected from hydrochloric acid and acetic acid is more preferable, from the viewpoint of versatility.

Examples of the alkaline compounds include inorganic alkaline compounds such as ammonia and potassium hydroxide; and organic alkaline compounds such as alkylamine and alkanolamine. Of these, at least one selected from ammonia and alkylamine is preferable, and ammonia is more preferable, from the viewpoint of improving the quality of a semiconductor substrate.

Examples of the polishing auxiliary agent other than the macromolecule X include anionic surfactants and nonionic surfactants. Examples of the anionic surfactants include alkyl ether acetates, alkyl ether phosphates, and alkyl ether sulfates. Examples of the nonionic surfactants include nonionic polymers such as polyacrylamide, and polyoxyalkylene alkyl ethers. Although the polishing auxiliary agent may be a branched macromolecule or a cross-linked macromolecule, it is preferable that the polishing liquid composition according to the present invention does not contain a branched macromolecule or a cross-linked macromolecule from the viewpoint of improving the polishing speed.

When the polishing liquid composition according to the present invention is used to polish a silicon oxide film formed on a silicon nitride film, it is preferable that an aspect of the polishing liquid composition contains an anionic macromolecular compound Y (also referred to as "macromolecule Y" hereinafter) as a polishing auxiliary agent for inhibiting the polishing of the silicon nitride film. With an example of the polishing liquid composition according to the present invention containing the macromolecule Y, high polishing selectivity can be realized: specifically, the silicon oxide film can be polished at a high speed, while the polishing of the silicon nitride film can be inhibited. Accordingly, the method for manufacturing a semiconductor device and a method for polishing a silicon oxide film in which the polishing liquid composition is used can contribute to improving the quality and improving the productivity of a semiconductor device.

Examples of the anionic group in the macromolecule Y include a carboxy group, a sulfonic group, a sulfate group, a phosphate group, and a phosphonate group. And a carboxy group, a sulfonic group, a phosphate group, and a phosphonate group are preferable. These anionic groups may be in the form of a neutralized salt. In the case where the anionic group is in the form of a salt, examples of the counter ion include a metal ion, an ammonium ion, and an alkylammonium ion, and an ammonium ion is preferable from the viewpoint of improving the quality of a semiconductor device.

The macromolecule Y is at least one selected from copolymers of polyacrylic acid, polymethacrylic acid, polyvinyl phosphonic acid, polyvinyl sulfonic acid, polystyrene sulfonic acid, and (meth)acrylic acid and monomethoxy polyethylene glycol mono(meth)acrylate, copolymers of a (meth)acrylate having an anionic group and monomethoxy polyethylene glycol mono(meth)acrylate, copolymers of an alkyl (meth)acrylate, (meth)acrylic acid, and monomethoxy polyethylene glycol mono(meth)acrylate, copolymers of (meth)acrylic acid and 2-acrylamide-2-methylpropane sulfonic acid (AMPS), alkaline metal salts thereof, and ammonium salts thereof. And the macromolecule Y is preferably at least one selected from copolymers of polyvinyl phosphonic acid, polyvinyl sulfonic acid, polyacrylic acid, and (meth)acrylic acid and 2-acrylamide-2-methylpropane sulfonic acid (AMPS), and ammonium salts thereof, and more preferably at least one selected from copolymers of polyvinyl phosphonic acid, polyacrylic acid, and (meth)acrylic acid and 2-acrylamide-2-methylpropane sulfonic acid (AMPS), and ammonium salts thereof, from the viewpoint of improving the quality of a semiconductor substrate.

The weight average molecular weight of the macromolecule Y is preferably 1,000 or more, more preferably 3,000 or more, and even more preferably 5,000 or more, and is preferably 5,500,000 or less, more preferably 1,000,000 or less, and even more preferably 100,000 or less, from the viewpoint of ensuring polishing speed and improving the selectivity of polishing (polishing selectivity), which is the selectivity that makes a silicon nitride film less likely to be polished than a silicon oxide film. The weight average molecular weight of the macromolecule Y can be measured using the method described in Examples.

The content of the macromolecule Y in the polishing liquid composition according to the present invention is preferably 0.001 mass % or more, more preferably 0.0015 mass % or more, and even more preferably 0.0025 mass % or more, and is preferably 5 mass % or less, more preferably 3 mass % or less, and even more preferably 2 mass % or less, from the viewpoint of ensuring the polishing speed and improving the polishing selectivity.

The ratio between the contents of the cerium oxide particles and the macromolecule Y in the polishing liquid composition according to the present invention (cerium oxide particles/macromolecule Y) is preferably 0.05 or more, more preferably 0.08 or more, and even more preferably 0.12 or more, and is preferably 500 or less, more preferably 250 or less, and even more preferably 150 or less, from the viewpoint of ensuring the silicon oxide film polishing speed and improving the polishing selectivity.

Polishing Liquid Composition

The polishing liquid composition according to the present invention can be manufactured using a manufacturing method including a step of blending a dispersion liquid (slurry) containing cerium oxide particles and an aqueous medium, and the macromolecule X, and other optional components as needed, using a known method. For example, the polishing liquid composition according to the present invention is obtained by blending a slurry containing cerium oxide particles and an aqueous medium, and an aqueous macromolecule solution containing the macromolecule X and an aqueous medium, and other optional components as needed. The term "blending" as used in the present invention encompasses mixing cerium oxide particles, the macromolecule X, and the aqueous medium, and other optional components as needed, simultaneously or successively. There is no particular limitation on the mixing order. A mixer such as a homomixer, a homogenizer, an ultrasonic dispersion machine, or a wet ball mill can be used to perform the above-mentioned blending, for example. The blend amounts of the components in the method for manufacturing the polishing liquid composition according to the present invention can be set to be the same as the above-described contents of the components in the polishing liquid composition according to the present invention.

An embodiment of the polishing liquid composition of the present invention may be of a so-called single-component type supplied to a commercial outlet in a state in which all of the components are mixed in advance, or of a so-called two-component type whose components are to be mixed at the time of use.

The pH of the polishing liquid composition according to the present invention is preferably 2.5 or higher, more preferably 3.0 or higher, even more preferably 3.5 or higher, even more preferably 4.0 or higher, and even more preferably 5.5 or higher, from the viewpoint of improving the polishing speed, and is preferably 12.0 or lower, more preferably 11.5 or lower, and even more preferably 11.0 or lower, from the viewpoint of storage stability. In the case where the polishing liquid composition according to the present invention is used to polish a silicon oxide film on a silicon nitride film, the pH of the polishing liquid composition according to the present invention is preferably 2.5 or higher, more preferably 3.0 or higher, even more preferably 3.5 or higher, even more preferably 4.0 or higher, and even more preferably 5.5 or higher, and is preferably 9.5 or lower, more preferably 8.0 or lower, and even more preferably 7.5 or lower, from the viewpoint of ensuring the silicon oxide film polishing speed and improving the polishing selectivity. In the present invention, the pH of the polishing liquid composition is a value obtained by performing the measurement at 25° C. using a pH meter. Specifically, the pH of the polishing liquid composition according to the present invention can be measured using the method described in Examples.

The term "the contents of the components in the polishing liquid composition" as used in the present invention refers to the contents of the above-mentioned components at the time of using the polishing liquid composition for polishing. The polishing liquid composition according to the present invention may be stored and supplied in a concentrated state as long as the stability is not impaired. This is preferable because the manufacturing cost and transportation cost can be reduced. This concentrated solution can be used in the polishing process after being diluted as appropriate using the above-described aqueous medium as needed. The dilution ratio is preferably 5- to 100-fold dilution.

Polishing-Target Film

Since the polishing liquid composition according to the present invention can be used to polish a silicon oxide film at a high speed, this polishing liquid composition can be favorably used to polish a silicone oxide film included in a three-dimensional NAND flash memory or the like in which recording elements are three-dimensionally arranged, and to polish a silicon oxide film in a process for forming an element isolation structure of a semiconductor device or the like.

Polishing Liquid Kit

Another aspect of the present invention is a polishing liquid kit (two-component-type polishing liquid composition) for manufacturing a polishing liquid composition. The polishing liquid kit includes a dispersion liquid of cerium oxide particles (first liquid) obtained by dispersing cerium oxide particles in an aqueous medium and the rest (second liquid), and the first liquid and the second liquid are contained in separate containers and stored in a state in which they are not mixed together, and are to be mixed at the time of use.

The kit includes the dispersion liquid of cerium oxide particles (first liquid) and the rest (second liquid), and the first liquid and the second liquid are contained in separate containers and stored in a state in which they are not mixed together, and are to be mixed at the time of use. The macromolecule X may be contained in one or both of the first liquid and the second liquid. The above-mentioned "optional components" may be contained in the first liquid and the second liquid as optional components as needed. The first liquid and the second liquid may be mixed together before being supplied to the surface of a polishing target, or may be separately supplied and mixed together on the surface of a polishing-target substrate.

The contents of the components in the first liquid and the second liquid may be set such that favorable contents in the polishing liquid composition for use in the polishing process can be obtained when the first liquid and the second liquid are mixed together, or may be set such that favorable contents in the polishing liquid composition for use in the polishing process can be obtained when the first liquid, the second liquid, and water are mixed together.

Additive Composition for Silicon Oxide Film Polishing

Another aspect of the present invention relates to an additive composition for silicon oxide film polishing (which will be abbreviated as "additive composition" hereinafter) that is to be used together with a dispersion liquid (first liquid) obtained by dispersing cerium oxide particles in an aqueous medium and contains an aqueous medium and the macromolecule X dissolved in the aqueous medium. The above-mentioned "optional components" may be contained in the additive composition as optional components as needed. A polishing liquid composition with which the silicon oxide film polishing speed can be improved is obtained by mixing the additive composition with an aqueous dispersion liquid of cerium oxide particles, which is provided separately from the additive composition, at the time of use and mixing the aqueous medium and optional components therewith as needed.

The content of the macromolecule X in the additive composition is preferably 0.005 mass % or more, more preferably 0.01 mass % or more, and even more preferably 0.03 mass % or more, from the viewpoint of production of the concentrated additive composition, and is preferably 30 mass % or less, more preferably 10 mass % or less, and even more preferably 5 mass % or less, from the viewpoint of handleability at the time of mixing with the aqueous dispersion liquid of cerium oxide particles.

Method for Manufacturing Semiconductor Device

Another aspect of the present invention relates to a method for manufacturing a semiconductor device (also referred to as "method for manufacturing a semiconductor substrate according to the present invention" hereinafter) that includes a step of polishing a surface of a silicon oxide film on a side opposite to a surface in contact with a silicon nitride film (e.g., an uneven stepped surface of the silicon oxide film) using the polishing liquid composition according to the present invention (also referred to as "polishing step in which the polishing liquid composition according to the present invention is used" hereinafter). With the method for manufacturing a semiconductor device according to the present invention, a silicon oxide film can be polished at a high speed, and thus an effect in which a semiconductor device can be efficiently manufactured can be exhibited.

The uneven stepped surface of a silicon oxide film may be spontaneously formed corresponding to a step of the layer under the silicon oxide film when the silicon oxide film is formed using a chemical vapor deposition method or the like, or may be obtained by forming an uneven pattern using a lithography method or the like, for example.

A specific example of the method for manufacturing a semiconductor substrate according to the present disclosure is performed as follows. First, a silicon substrate is exposed to oxygen in an oxidation furnace to grow a silicon dioxide layer on its surface. Next, a polishing stopper film such as a silicon nitride ($Si_3N_4$) film or a polysilicon film is formed on the silicon dioxide layer using a CVD method (Chemical Vapor Deposition method), for example. Then, a photolithography technique is used to form a trench in the substrate including the silicon substrate and the polishing stopper film provided on one of the main surfaces of the silicon substrate (e.g., the substrate obtained by forming the polishing stopper film on the silicon dioxide layer of the silicon substrate). Subsequently, a silicon oxide ($SiO_2$) film that serves as a polishing-target film to fill the trench is formed using a CVD method in which a silane gas and an oxygen gas are used, for example, and thus a polishing-target substrate in which the polishing stopper film is covered by the polishing-target film (silicon oxide film) is obtained. Due to the formation of the silicon oxide film, the trench is filled with silicon oxide forming the silicon oxide film, and a surface of the polishing stopper film on a side opposite to the silicon substrate is covered by the silicon oxide film. A surface of the thus-formed silicon oxide film on a side opposite to the silicon substrate is provided with a step formed corresponding to the unevenness of the layer thereunder. Next, the silicon oxide film is polished using a CMP method until at least the surface of the polishing stopper film on a side opposite to the silicon substrate is exposed. More preferably, the silicon oxide film is polished using a CMP method until the surface of the silicon oxide film and the surface of the polishing stopper film are flush with each other. The polishing liquid composition according to the present disclosure can be used in this polishing step in which a CMP method is used.

In the polishing step in which the polishing liquid composition according to the present invention is used, the rotation speed of a polishing pad can be set to 30 to 200 r/minute, for example, the rotation number of the polishing-target substrate can be set to 30 to 200 r/minute, for example, the polishing load applied by a polishing apparatus provided with the polishing pad can be set to 20 to 500 g-weight$km^2$, for example, and the supply speed of the polishing liquid composition is set to 10 to 500 mL/minute or slower, for example.

Conventionally known materials and the like can be used as the material and the like of the polishing pad used in the polishing step in which the polishing liquid composition according to the present invention is used. Examples of the material of the polishing pad include organic macromolecular foams such as a hard polyurethane foam and non-foamed materials, and in particular, a hard polyurethane foam is preferable.

Method for Polishing Silicon Oxide Film

Another aspect of the present invention relates to a method for polishing a silicon oxide film (also referred to as "polishing method according to the present invention hereinafter) that includes a step of polishing a silicon oxide film using the polishing liquid composition for a silicon oxide film according to the present invention, the silicon oxide film being an insulating film formed in a process for manufacturing a semiconductor device. The above-mentioned process includes a step of polishing a silicon oxide film on a silicon nitride film, for example.

The polishing speed can be improved by using the polishing method according to the present invention, and thus an effect in which the productivity of a semiconductor device can be improved can be exhibited. A specific polishing method and specific polishing conditions are the same as those in the above-described method for manufacturing a semiconductor device according to the present invention.

The present application further discloses the following aspects.

[1] A polishing liquid composition for a silicon oxide film, including:
cerium oxide particles;
a water-soluble macromolecular compound; and
an aqueous medium,
wherein the water-soluble macromolecular compound is a water-soluble macromolecular compound including a betaine structure, excluding carbobetaine homopolymers and sulfobetaine homopolymers.

[2] The polishing liquid composition for a silicon oxide film according to [1] above, wherein the water-soluble macromolecular compound is a water-soluble macromolecular compound containing a constitutional unit A including a betaine structure, and a constitutional unit B that is a constitutional unit other than the constitutional unit A and contains at least one group of a primary amino group, a secondary amino group, a tertiary amino group, a quaternary ammonium group, and salts thereof.

[3] The polishing liquid composition for a silicon oxide film according to [1] or [2] above, wherein the water-soluble macromolecular compound is a water-soluble macromolecular compound containing a constitutional unit a represented by Formula (1):

Chemical Formula 3

$$\begin{array}{c} R^1 \ \ R^3 \\ | \ \ | \\ -\!\!-\!\!C\!\!-\!\!C\!\!-\!\!- \\ | \ \ | \\ R^2 \ \ C\!\!=\!\!O \\ | \\ X^1 \\ | \\ R^4 \\ | \\ R^5\!\!-\!\!N^+\!\!-\!\!R^6 \\ | \\ X^2 \end{array} \quad (1)$$

where $R^1$ to $R^3$ are the same as or different from each other and represent a hydrogen atom, a methyl group, or an ethyl group, $R^4$ represents an alkylene group having 1 to 4 carbon atoms or $-Y^1-OPO_3^--Y^2-$, $Y^1$ and $Y^2$ are the same as or different from each other and represent an alkylene group having 1 to 4 carbon atoms, $R^5$ and $R^6$ are the same as or different from each other and represent a hydrocarbon group having 1 to 4 carbon atoms, $X^1$ represents O or $NR^7$, $R^7$ represents a hydrogen atom or a hydrocarbon group having 1 to 4 carbon atoms, $X^2$ represents a hydrocarbon group having 1 to 4 carbon atoms, $-R^{17}SO_3^-$, or $-R^{18}COO^-$, and $R^{17}$ and $R^{18}$ are the same as or different from each other and represent an alkylene group having 1 to 4 carbon atoms, and when $R^4$ is an alkylene group having 1 to 4 carbon atoms, $X^2$ is $-R^{17}SO_3^-$ or $-R^{18}COO^-$, and when $R^4$ is $-Y^1-OPO_3^--Y^2-$, $X^2$ is a hydrocarbon group having 1 to 4 carbon atoms.

[4] The polishing liquid composition for a silicon oxide film according to [2] or [3] above, wherein the water-soluble macromolecular compound is a water-soluble macromolecular compound containing a constitutional unit b represented by Formula (2):

Chemical Formula 4

$$\begin{array}{c} R^8 \ \ R^{10} \\ | \ \ | \\ -\!\!-\!\!C\!\!-\!\!C\!\!-\!\!- \\ | \ \ | \\ R^9 \ \ C\!\!=\!\!O \\ | \\ X^3 \\ | \\ R^{11} \\ | \\ X^4 \end{array} \quad (2)$$

where $R^8$ to $R^{10}$ are the same as or different from each other and represent a hydrogen atom, a methyl group, or an ethyl group, $X^3$ represents O or $NR^{19}$, $R^{19}$ represents a hydrogen atom or a hydrocarbon group having 1 to 4 carbon atoms, $R^{11}$ represents an alkylene group having 1 to 22 carbon atoms, where a hydrogen atom of the alkylene group is optionally substituted by a hydroxy group, $X^4$ represents $N^+R^{12}R^{13}R^{14}$ or $NR^{15}R^{16}$, $R^{12}$ to $R^{14}$ are the same as or different from each other and represent a hydrocarbon group having 1 to 4 carbon atoms, and $R^{15}$ and $R^{16}$ are the same as or different from each other and represent a hydrogen atom or a hydrocarbon group having 1 to 4 carbon atoms.

[5] The polishing liquid composition for a silicon oxide film according to any one of [1] to [4] above, wherein the water-soluble macromolecular compound is preferably a water-soluble macromolecular compound including a sulfobetaine structure, a carbobetaine structure, or a phosphobetaine structure, more preferably a water-soluble macromolecular compound including a carbobetaine structure or a phosphobetaine structure, and even more preferably a water-soluble macromolecular compound including a phosphobetaine structure.

[6] The polishing liquid composition for a silicon oxide film according to [2] above, wherein the constitutional unit A is preferably a constitutional unit derived from at least one monomer selected from sulfobetaine methacrylate, methacryloyloxyethyl phosphorylcholine, and carboxybetaine methacrylate, more preferably a constitutional unit derived from at least one monomer selected from methacryloyloxyethyl phosphorylcholine and carboxybetaine methacrylate, and even more preferably a constitutional unit derived from methacryloyloxyethyl phosphorylcholine.

[7] The polishing liquid composition for a silicon oxide film according to [2] above, wherein the constitutional unit B preferably contains at least one group of a secondary amino group, a tertiary amino group, a quaternary ammonium group, and salts thereof, more preferably at least one group of a quaternary ammonium group and salts thereof, and even more preferably a quaternary ammonium group.

[8] The polishing liquid composition for a silicon oxide film according to [2] above, wherein the constitutional unit B is preferably a constitutional unit derived from at least one monomer selected from an unsaturated monomer having an amino group such as a methacrylate having a primary amine, secondary amine, or tertiary amine in its structure, an unsaturated monomer having a cationic group such as a methacrylate having a quaternary ammonium cation in its structure, methacryloyloxyethyldimethylethyl aminium (MOEDES), 2-hydroxy-3-(trimethylaminio)propyl methacrylate (THMPA), methacryloylethyltrimethyl aminium (MOETMA), 2-aminoethyl methacrylate (MOEA), and 2-(diethylamino)ethyl methacrylate (MOEDEA), more preferably a constitutional unit derived from at least one monomer selected from THMPA, MOEA, and MOEDEA, and even more preferably a constitutional unit derived from THMPA.

[9] The polishing liquid composition for a silicon oxide film according to [2] above, wherein the molar ratio between the constitutional unit B and the constitutional unit A (constitutional unit B/constitutional unit A) in the water-soluble macromolecular compound is preferably 90/10 or less, more preferably 70/30 or less, and even more preferably 40/60 or less, and is preferably 5/95 or more, and more preferably 15/85 or more.

[10] The polishing liquid composition for a silicon oxide film according to any one of [1] to [9] above, wherein the weight average molecular weight of the water-soluble macromolecular compound is preferably 1,000 or more, more preferably 5,000 or more, and even more preferably 10,000 or more, and is preferably 3,000,000 or less, more preferably 2,000,000 or less, and even more preferably 1,000,000 or less.

[11] The polishing liquid composition for a silicon oxide film according to any one of [1] to [10] above, wherein the content of the water-soluble macromolecular compound in the polishing liquid composition is preferably 0.0005 mass % or more, more preferably 0.001 mass % or more, even more preferably 0.002 mass % or more, even more preferably 0.003 mass % or more, and even more preferably 0.005 mass % or more, and is preferably 1.0 mass % or less, more preferably 0.7 mass % or less, even more preferably 0.4 mass % or less, even more preferably 0.2 mass % or less, and even more preferably 0.08 mass % or less.

[12] The polishing liquid composition for a silicon oxide film according to any one of [1] to [11] above, wherein the mass ratio between the cerium oxide particles and the water-soluble macromolecular compound (cerium oxide particles/water-soluble macromolecular compound) in the polishing liquid composition is preferably 0.1 or more, more preferably 1.0 or more, and even more preferably 5.0 or more, and is preferably 500 or less, more preferably 200 or less, and even more preferably 80 or less.

[13] The polishing liquid composition for a silicon oxide film according to any one of [1] to [12] above, wherein the content of the cerium oxide particles contained in the polishing liquid composition is preferably 0.01 mass % or more, more preferably 0.05 mass % or more, even more preferably 0.1 mass % or more, even more preferably 0.15 mass % or more, and even more preferably 0.2 mass % or more, and is preferably 10 mass % or less, more preferably 8 mass % or less, even more preferably 7 mass % or less, even more preferably 6 mass % or less, and even more preferably 5 mass % or less.

[14] The polishing liquid composition for a silicon oxide film according to any one of [1] to [13] above, further including an anionic macromolecular compound.

[15] The polishing liquid composition for a silicon oxide film according to [14] above, wherein the anionic macromolecular compound contains an anionic group selected from a carboxy group, a sulfonic group, a phosphate group, a phosphonate group, and salts thereof.

[16] The polishing liquid composition for a silicon oxide film according to [14] or [15] above, wherein the anionic macromolecular compound is preferably at least one selected from copolymers of polyacrylic acid, polymethacrylic acid, polyvinyl phosphonic acid, polyvinyl sulfonic acid, polystyrene sulfonic acid, and (meth)acrylic acid and monomethoxy polyethylene glycol mono(meth)acrylate, copolymers of a (meth)acrylate having an anionic group and monomethoxy polyethylene glycol mono(meth)acrylate, copolymers of an alkyl (meth)acrylate, (meth)acrylic acid, and monomethoxy polyethylene glycol mono(meth)acrylate, copolymers of (meth)acrylic acid and 2-acrylamide-2-methylpropane sulfonic acid (AMPS), alkaline metal salts thereof, and ammonium salts thereof, more preferably at least one selected from copolymers of polyvinyl phosphonic acid, polyvinyl sulfonic acid, polyacrylic acid, and (meth)acrylic acid and 2-acrylamide-2-methylpropane sulfonic acid (AMPS), and ammonium salts thereof, and even more preferably at least one selected from copolymers of polyvinyl phosphonic acid, polyacrylic acid, and (meth)acrylic acid and 2-acrylamide-2-methylpropane sulfonic acid (AMPS), and ammonium salts thereof.

[17] The polishing liquid composition for a silicon oxide film according to any one of [14] to [16] above, wherein the weight average molecular weight of the anionic macromolecular compound is preferably 1,000 or more, more preferably 3,000 or more, and even more preferably 5,000 or more, and is preferably 5,500,000 or less, more preferably 1,000,000 or less, and even more preferably 100,000 or less.

[18] The polishing liquid composition for a silicon oxide film according to any one of [14] to [17] above, wherein the content of the anionic macromolecular compound contained in the polishing liquid composition is preferably 0.001 mass % or more, more preferably 0.0015 mass % or more, and even more preferably 0.0025 mass % or more, and is preferably 5 mass % or less, more preferably 3 mass % or less, and even more preferably 2 mass % or less.

[19] The polishing liquid composition for a silicon oxide film according to any one of [14] to [18] above, wherein the ratio between the contents of the cerium oxide particles and the anionic macromolecular compound contained in the polishing liquid composition (cerium oxide particles/anionic macromolecular compound) is preferably 0.05 or more, more preferably 0.08 or more, and even more preferably 0.12 or more, and is preferably 500 or less, more preferably 250 or less, and even more preferably 150 or less.

[20] A method for manufacturing a semiconductor device, including a step of polishing a silicon oxide film using the polishing liquid composition for a silicon oxide film according to any one of [1] to [19] above.

[21] The method for manufacturing a semiconductor device according to [20] above, wherein the step is a step of polishing a silicon oxide film on a silicon nitride film.

[22] A method for polishing a silicon oxide film, including a step of polishing a silicon oxide film using the polishing liquid composition for a silicon oxide film according to any one of [1] to [19] above, wherein the silicon oxide film is an insulating film formed in a process for manufacturing a semiconductor device.

[23] The method for polishing a silicon oxide film according to [22] above, wherein the step is a step of polishing a silicon oxide film on a silicon nitride film.

[24] Use of the polishing liquid composition for a silicon oxide film according to any one of [1] to [19] above for silicon oxide film polishing.

[25] A polishing liquid kit for preparing a polishing liquid composition for a silicon oxide film, including:
  a first liquid obtained by dispersing cerium oxide particles in an aqueous medium; and
  a second liquid that is contained in a container separate from a container containing the first liquid and contains an aqueous medium,
  wherein one or both of the first liquid and the second liquid further contains a water-soluble macromolecular compound, and
  the water-soluble macromolecular compound is a water-soluble macromolecular compound including a betaine structure, excluding carbobetaine homopolymers and sulfobetaine homopolymers.

[26] An additive composition for silicon oxide film polishing to be used together with a dispersion liquid obtained by dispersing cerium oxide particles in an aqueous medium, including:
  an aqueous medium; and
  a water-soluble macromolecular compound dissolved in the aqueous medium,
  wherein the water-soluble macromolecular compound is a water-soluble macromolecular compound including a betaine structure, excluding carbobetaine homopolymers and sulfobetaine homopolymers.

EXAMPLES

1. Preparation of Polishing Liquid Composition

Preparation of Polishing Liquid Compositions of Examples 1 to 12 and Comparative Examples 1 to 8

Polishing liquid compositions of Examples 1 to 12 and Comparative Examples 1 to 8 were each prepared by mixing a slurry of cerium oxide particles obtained by dispersing cerium oxide particles in an aqueous medium with a macromolecule solution obtained by dissolving the macromolecule X or a comparison substance thereof in an aqueous medium and adding a pH adjuster to the resulting solution as needed. However, comparison substances of the macromolecules X were not added to the polishing liquid compositions of Comparative Examples 1 and 2. As the pH adjuster, a 1 N aqueous solution of hydrochloric acid or a 1 N aqueous solution of ammonium was used. The pH values of the polishing liquid compositions of Examples 1 to 12 and Comparative Examples 1 to 8 at 25° C. were as shown in Table 2. The contents of the cerium oxide particles, the macromolecules X, and the comparison substances in the polishing liquid compositions were as shown in Table 2.

Preparation of Polishing Liquid Compositions of Examples 13 to 29 and Comparative Examples 9 to 16

Polishing liquid compositions of Examples 13 to 29 and Comparative Examples 9 to 16 were each prepared by mixing a slurry of cerium oxide particles obtained by dispersing cerium oxide particles in an aqueous medium with a macromolecule solution (additive composition) obtained by dissolving the macromolecule X or a comparison substance thereof and an anionic macromolecular compound (macromolecule Y) in an aqueous medium and adding a pH adjuster to the resulting solution as needed. However, comparison substances of the macromolecules X were not added to the polishing liquid compositions of Comparative Examples 9 and 11, and a comparison substance of the macromolecules X and the macromolecule Y were not added to the polishing liquid composition of Comparative Example 10. As the pH adjuster, a 1 N aqueous solution of hydrochloric acid or a 1 N aqueous solution of ammonium was used. The pH values of the polishing liquid compositions of Examples 13 to 29 and Comparative Examples 9 to 16 at 25° C. were as shown in Table 3. The contents of the cerium oxide particles, the macromolecules X, the comparison substances thereof, and the macromolecules Y in the polishing liquid compositions were as shown in Table 3.

The details of the cerium oxide particles used to prepare the polishing liquid compositions of Examples 1 to 29 and Comparative Examples 1 to 16 were as follows.

Pulverized ceria A (pulverized ceria; average primary particle diameter=37.9 nm, D50=165 nm, average crystallite diameter=23.2 nm)

HC-60 (colloidal ceria manufactured by Solvay Special Chem Japan, Ltd., product name: ZENUS HC-60; average primary particle diameter=67.7 nm, D50=137 nm, average crystallite diameter=37.6 nm)

The details of constitutional monomers of the macromolecules X and the comparison substances thereof used to prepare the polishing liquid compositions of Examples 1 to 29 were as listed below and as shown in Table 1.

MPC: 2-methacryloyloxyethyl phosphorylcholine

SBMA: [2-(methacryloyloxy)ethyl]dimethyl-(3-sulfopropyl) ammonium hydroxide

CBMA: N-(2-carboxyethyl)-N-methacryloxyethyl-N,N-dimethylammonium betaine

THMPA: N,N,N-trimethyl-N-(2-hydroxy-3-methacryloyloxypropyl)-ammonium chloride

MOEA: 2-aminoethyl methacrylate hydrochloride

MOEDEA: 2-(diethylamino)ethyl methacrylate

TABLE 1

| Constitutional monomer | Structures in Formula (1) | Structures in Formula (2) |
|---|---|---|
| SBMA | $R^1 = R^2 = H, R^3 = CH_3, R^4 = C_2H_4,$ $R^5 = R^6 = CH^3, X^1 = O,$ $X^2 = -R^{17}SO_3^-, R^{17} = C_3H_6$ | — |
| MPC | $R^1 = R^2 = H, R^3 = CH_3,$ $R^4 = -Y^1-OPO_3^--Y^2-,$ $Y^1 = Y^2 = C_2H_4, R^5 = R^6 = CH_3,$ $X^1 = O, X^2 = C_3$ | — |
| THMPA | — | $R^8 = R^9 = H, R^{10} = CH_3, X_3 = O$ $R^{11} = CH_2CH(OH)CH_2$ $X^4 = N^+R^{12}R^{13}R^{14},$ $R^{12} = R^{13} = R^{14} = CH_3$ |
| CBMA | $R^1 = R^2 = H, R^3 = CH_3,$ $R^4 = C_2H_4, R^5 = R^6 = CH_3,$ $X^1 = O, X^2 = -R^{18}COO^-,$ $R^{18} = CH_2$ | — |
| MOEA | — | $R^8 = R^9 = H, R^{10} = CH_3, X_3 = O$ $R^{11} = C_2H_4$ $X^4 = NR^{15}R^{16}$ $R^{15} = R^{16} = H$ |
| MOEDEA | — | $R^8 = R^9 = H, R^{10} = CH_3, X_3 = O$ $R^{11} = C_2H_4$ $X^4 = NR^{15}R^{16}$ $R^{15} = R^{16} = CH_2CH_3$ |

Manufacturing of Macromolecule X1

In a 500-mL four-neck flask, 60 g of ultrapure water was placed and heated to 65° C. A solution obtained by mixing 5.0 g of 2-methacryloyloxyethyl phosphorylcholine (manufactured by Tokyo Chemical Industry Co., Ltd.), 2.0 g of BLEMMER QA (manufactured by NOF Corporation), and 40 g of ultrapure water together and a solution obtained by mixing 0.057 g of V-50 (manufactured by Wako Pure Chemical Industries, Ltd.) and 20 g of ultrapure water together were separately dropped into the water in the flask over a 2-hour period, and polymerization was carried out. After having been matured for 6 hours, the resulting solution was allowed to cool to room temperature, and thus an aqueous polymer solution containing a macromolecule X1 was obtained. The molar ratio between the constitutional units (THMPA/MPC) in the macromolecule X1 was 20/80, and the weight average molecular weight of the macromolecule X1 was 500,000.

Manufacturing of Macromolecule X2

In a 500-mL four-neck flask, 52 g of ultrapure water was placed and heated to 65° C. A solution obtained by mixing 5.0 g of 2-methacryloyloxyethyl phosphorylcholine (manufactured by Tokyo Chemical Industry Co., Ltd.), 0.42 g of BLEMMER QA (manufactured by NOF Corporation), and 35 g of ultrapure water together and a solution obtained by mixing 0.048 g of V-50 (manufactured by Wako Pure Chemical Industries, Ltd.) and 17 g of ultrapure water together were separately dropped into the water in the flask over a 2-hour period, and polymerization was carried out. After having been matured for 6 hours, the resulting solution was allowed to cool to room temperature, and thus an aqueous polymer solution containing a macromolecule X2 was obtained. The molar ratio between the constitutional units (THMPA/MPC) in the macromolecule X2 was 5/95, and the weight average molecular weight of the macromolecule X2 was 300,000.

Manufacturing of Macromolecule X3

In a 500-mL four-neck flask, 90 g of ultrapure water was placed and heated to 65° C. A solution obtained by mixing 5.0 g of 2-methacryloyloxyethyl phosphorylcholine (manufactured by Tokyo Chemical Industry Co., Ltd.), 8.1 g of BLEMMER QA (manufactured by NOF Corporation), and 60 g of ultrapure water together and a solution obtained by mixing 0.092 g of V-50 (manufactured by Wako Pure Chemical Industries, Ltd.) and 30 g of ultrapure water together were separately dropped into the water in the flask over a 2-hour period, and polymerization was carried out. After having been matured for 6 hours, the resulting solution was allowed to cool to room temperature, and thus an aqueous polymer solution containing a macromolecule X3 was obtained. The molar ratio between the constitutional units (THMPA/MPC) in the macromolecule X3 was 50/50, and the weight average molecular weight of the macromolecule X3 was 520,000.

Manufacturing of Macromolecule X4

In a 1000-mL four-neck flask, 210 g of ultrapure water was placed and heated to 65° C. A solution obtained by mixing 5.0 g of 2-methacryloyloxyethyl phosphorylcholine (manufactured by Tokyo Chemical Industry Co., Ltd.), 32.2 g of BLEMMER QA (manufactured by NOF Corporation), and 140 g of ultrapure water together and a solution obtained by mixing 0.23 g of V-50 (manufactured by Wako Pure Chemical Industries, Ltd.) and 70 g of ultrapure water together were separately dropped into the water in the flask over a 2-hour period, and polymerization was carried out. After having been matured for 6 hours, the resulting solution was allowed to cool to room temperature, and thus an aqueous polymer solution containing a macromolecule X4 was obtained. The molar ratio between the constitutional units (THMPA/MPC) in the macromolecule X4 was 80/20, and the weight average molecular weight of the macromolecule X4 was 150,000.

Manufacturing of Macromolecule X5

In a 500-mL four-neck flask, 64 g of ultrapure water was placed and heated to 65° C. A solution obtained by mixing 5.0 g of N-(2-carboxyethyl)-N-methacryloxyethyl-N,N-dimethylammonium betaine (manufactured by Osaka Organic Chemical Industry Ltd.), 2.76 g of BLEMMER QA (manufactured by NOF Corporation), and 43 g of ultrapure water together and a solution obtained by mixing 0.079 g of V-50 (manufactured by Wako Pure Chemical Industries, Ltd.) and 21 g of ultrapure water together were separately dropped into the water in the flask over a 2-hour period, and polymerization was carried out. After having been matured for 6 hours, the resulting solution was allowed to cool to room temperature, and thus an aqueous polymer solution containing a macromolecule X5 was obtained. The molar ratio between the constitutional units (THMPA/CBMA) in the macromolecule X5 was 20/80, and the weight average molecular weight of the macromolecule X5 was 310,000.

Manufacturing of Macromolecule X6

In a 500-mL four-neck flask, 61 g of ultrapure water was placed and heated to 65° C. A solution obtained by mixing 5.0 g of [2-(methacryloyloxy)ethyl]dimethyl-(3-sulfopropyl) ammonium hydroxide (manufactured by SIGMA-ALDRICH), 2.12 g of BLEMMER QA (manufactured by NOF Corporation), and 40 g of ultrapure water together and a solution obtained by mixing 0.061 g of V-50 (manufactured by Wako Pure Chemical Industries, Ltd.) and 20 g of ultrapure water together were separately dropped into the water in the flask over a 2-hour period, and polymerization was carried out. After having been matured for 6 hours, the resulting solution was allowed to cool to room temperature, and thus an aqueous polymer solution containing a macromolecule X6 was obtained. The molar ratio between the constitutional units (THMPA/SBMA) in the macromolecule X6 was 20/80, and the weight average molecular weight of the macromolecule X6 was 460,000.

Manufacturing of Macromolecule X7

In a 500-mL four-neck flask, 57 g of ultrapure water was placed and heated to 65° C. A solution obtained by mixing 5.0 g of 2-methacryloyloxyethyl phosphorylcholine (manufactured by Tokyo Chemical Industry Co., Ltd.), 0.70 g of 2-aminoethyl methacrylate hydrochloride (manufactured by SIGMA-ALDRICH), and 38 g of ultrapure water together and a solution obtained by mixing 0.057 g of V-50 (manufactured by Wako Pure Chemical Industries, Ltd.) and 19 g of ultrapure water together were separately dropped into the water in the flask over a 2-hour period, and polymerization was carried out. After having been matured for 6 hours, the resulting solution was allowed to cool to room temperature, and thus an aqueous polymer solution containing a macromolecule X7 was obtained. The molar ratio between the constitutional units (MOEA/MPC) in the macromolecule X7 was 20/80, and the weight average molecular weight of the macromolecule X7 was 330,000.

Manufacturing of Macromolecule X8

In a 500-mL four-neck flask, 58 g of ultrapure water was placed and heated to 65° C. A solution obtained by mixing 5.0 g of 2-methacryloyloxyethyl phosphorylcholine (manufactured by Tokyo Chemical Industry Co., Ltd.), 0.78 g of 2-(diethylamino)ethyl methacrylate (manufactured by Tokyo Chemical Industry Co., Ltd.), and 39 g of ultrapure water together and a solution obtained by mixing 0.057 g of V-50 (manufactured by Wako Pure Chemical Industries, Ltd.) and 19 g of ultrapure water together were separately dropped into the water in the flask over a 2-hour period, and polymerization was carried out. After having been matured for 6 hours, the resulting solution was allowed to cool to room temperature, and thus an aqueous polymer solution containing a macromolecule X8 was obtained. The molar ratio between the constitutional units (MOEDEA/MPC) in the macromolecule X8 was 20/80, and the weight average molecular weight of the macromolecule X8 was 250,000.

Macromolecule X9

MPC (2-methacryloyloxyethyl phosphorylcholine) homopolymer (Lipidure-HM; manufactured by NOF Corporation)

The details of the comparison substances of the macromolecules X used to prepare the polishing agent compositions of Comparative Examples 1 to 16 were as follows.

Comparison Substance X11

Carbobetaine monomer (N-(2-carboxyethyl)-N-methacryloxyethyl-N,N-dimethylammonium betaine; manufactured by Osaka Organic Chemical Industry Ltd.)

Manufacturing of Comparison Substance X12

In a 500-mL four-neck flask, 50 g of ultrapure water was placed and heated to 65° C. A solution obtained by mixing 5.0 g of N-(2-carboxyethyl)-N-methacryloxyethyl-N,N-dimethylammonium betaine (manufactured by Osaka Organic Chemical Industry Ltd.) and 33 g of ultrapure water together and a solution obtained by mixing 0.063 g of V-50 (manufactured by Wako Pure Chemical Industries, Ltd.) and 17 g of ultrapure water together were separately dropped into the water in the flask over a 2-hour period, and polymerization was carried out. After having been matured for 6 hours, the resulting solution was allowed to cool to room temperature, and thus an aqueous polymer solution containing a comparison substance X12 (CBMA homopolymer) was obtained. The weight average molecular weight of the comparison substance X12 was 360,000.

Manufacturing of Comparison Substance X13

In a 500-mL four-neck flask, 50 g of ultrapure water was placed and heated to 65° C. A solution obtained by mixing 5.0 g of [2-(methacryloyloxy)ethyl]dimethyl-(3-sulfopropyl) ammonium hydroxide (manufactured by SIGMA-ALDRICH) and 33 g of ultrapure water together and a solution obtained by mixing 0.049 g of V-50 (manufactured by Wako Pure Chemical Industries, Ltd.) and 17 g of ultrapure water together were separately dropped into the water in the flask over a 2-hour period, and polymerization was carried out. After having been matured for 6 hours, the resulting solution was allowed to cool to room temperature, and thus an aqueous polymer solution containing a comparison substance X13 (SBMA homopolymer) was obtained. The weight average molecular weight of the comparison substance X13 was 440,000.

Comparison Substance X14

Betaine (trimethylglycine; manufactured by Wako Pure Chemical Industries, Ltd.)

Manufacturing of Comparison Substance X15

In a 500-mL four-neck flask, 50 g of ultrapure water was placed and heated to 65° C. A solution obtained by mixing 10.0 g of BLEMMER QA (manufactured by NOF Corporation) and 33 g of ultrapure water together and a solution obtained by mixing 0.057 g of V-50 (manufactured by Wako Pure Chemical Industries, Ltd.) and 17 g of ultrapure water together were separately dropped into the water in the flask over a 2-hour period, and polymerization was carried out. After having been matured for 6 hours, the resulting solution was allowed to cool to room temperature, and thus an aqueous polymer solution containing a comparison substance X15 (THMPA homopolymer) was obtained. The weight average molecular weight of the comparison substance X15 was 220,000.

Manufacturing of Comparison Substance X16

In a 500-mL four-neck flask, 75 g of ultrapure water was placed and heated to 65° C. A solution obtained by mixing 2.0 g of methacrylic acid (MAA; manufactured by Tokyo Chemical Industry Co., Ltd.), 11.0 g of BLEMMER QA (manufactured by NOF Corporation), and 50 g of ultrapure water together and a solution obtained by mixing 0.13 g of V-50 (manufactured by Wako Pure Chemical Industries, Ltd.) and 25 g of ultrapure water together were separately dropped into the water in the flask over a 2-hour period, and polymerization was carried out. After having been matured for 6 hours, the resulting solution was allowed to cool to room temperature, and thus an aqueous polymer solution containing a comparison substance X16 was obtained. The molar ratio between the constitutional units (THMPA/MAA) in the comparison substance X16 was 50/50, and the weight average molecular weight of the comparison substance X16 was 280,000.

The details of the macromolecules Y used to prepare the polishing agent compositions of Examples 14 to 29 and Comparative Examples 9, 11, and 12 to 16 were as follows.

Preparation of PAA

In a separable flask equipped with a reflux tube, a stirring device, a thermometer, and a nitrogen introduction tube, 796.75 g of deionized water was placed and heated to 98° C. A solution obtained by dissolving 875.3 g of acrylic acid (manufactured by Wako Pure Chemical Industries, Ltd., special grade, 98% purity) and 116 g of ammonium persulfate (manufactured by Wako Pure Chemical Industries, Ltd., special grade, 98% purity) serving as an initiator was dropped into the water in the flask over a 2-hour period, and polymerization was carried out while the temperature was kept at 98° C. Then, the resulting solution was matured for 1 hour while the temperature was kept at 98° C., and thus polyacrylic acid with an average molecular weight of 23,000 was obtained. The obtained polyacrylic acid was cooled to 40° C., and 721.2 g of a 28 mass % aqueous solution of ammonia (manufactured by Wako Pure Chemical Industries, Ltd., special grade) was dropped thereinto over a 1-hour period while the temperature was kept at 40° C. Thus, ammonium polyacrylate with a neutralization degree of 100% was prepared.

Polyvinyl phosphonic acid; manufactured by Maruzen Petrochemical, weight average molecular weight of 9,100

Polyvinyl sulfonic acid (poly(vinyl sulfonic acid, sodium salt) solution; manufactured by Wako Pure Chemical Industries, Ltd., weight average molecular weight of 4,000 to 6,000)

P(AA/AMPS): (molar ratio (AA/AMPS)=80/20, copolymer of acrylic acid/acrylamide-2-methylpropane sulfonic acid; manufactured by TOAGOSEI Co., Ltd., weight average molecular weight of 24,000)

2. Measurement Methods for Various Parameters

Weight Average Molecular Weight of Macromolecules X and Comparison Substances Thereof The weight average molecular weights of the macromolecules X and the comparison substances thereof used to prepare the polishing liquid compositions were calculated based on the peaks in chromatograms obtained by performing gel permeation chromatography (GPC) under the conditions listed below.

Apparatus: HLC-8320 GPC (TOSOH Corporation, detector-integrated type)

Column: Two columns (TSKgel α-M; manufactured by TOSOH Corporation) coupled in series Eluent: 0.15 mol $Na_2SO_4$/1% $CH_3COOH$/water Flow rate: 1.0 mL/min Column temperature: 40° C.

Detector: RI detector

Standard substance: Pullulan

Weight Average Molecular Weights of Macromolecules Y etc.

The weight average molecular weights of the macromolecules Y used to prepare the polishing liquid compositions were calculated based on the peaks in chromatograms obtained by performing gel permeation chromatography (GPC) under the conditions listed below.

Apparatus: HLC-8320 GPC (TOSOH Corporation, detector-integrated type)
Column: G4000PWXL and G2500PWXL (manufactured by TOSOH Corporation) coupled in series
Eluent: 0.2 M MPB/CH$_3$CN=90/10
Flow rate: 1.0 mL/min
Column temperature: 40° C.
Detector: RI, UV detector
Standard substance: Polyethylene glycol pH Values of Polishing Liquid Compositions The pH values of the polishing liquid compositions at 25° C. were obtained through measurement using a pH meter (HM-30G; manufactured by TOA Electronics Ltd.) performed 1 minute after an electrode was immersed in the polishing liquid compositions.

Average Primary Particle Diameter of Cerium Oxide Particles

The average primary particle diameter (nm) of the cerium oxide particles means a particle diameter (on a spherical shape basis) calculated based on the equation below using a specific surface area S (m$^2$/g) calculated using a BET (nitrogen adsorption) method, and was calculated based on the equation below.

The specific surface area S in the equation below was determined as follows. That is, 10 g of a slurry of cerium oxide particles was dried under reduced pressure at 110° C. to remove moisture and then the thus-obtained dry matter was pulverized in an agate mortar. The resulting powder was subjected to measurement using a fluid-type automatic specific surface area measurement apparatus FlowSorb 2300 (manufactured by Shimadzu Corporation).

$$\text{Average primary particle diameter (nm)}=820/S$$

Average Crystallite Diameter of Cerium Oxide Particles

The average crystallite diameter was determined through powder X-ray diffraction. That is, a slurry of the cerium oxide particles was dried in a dryer at 120° C. and then the thus-obtained dry matter was pulverized on a mortar to produce CeO$_2$ powder. This powder was subjected to measurement using an X-ray diffraction apparatus (RINT2500 manufactured by Rigaku Corporation; CuK α rays; λ=1.5418 Å) in which the measurement angle was set to 10° to 70°, and the average crystallite diameter was calculated based on Scherrer's equation (the equation below) using the peak value of the main peak (1,1,1) plane of CeO$_2$ observed near 28° to 30°.

$$\text{Average crystallite diameter}=C\times\lambda/\beta/\cos\theta$$

λ: Wavelength of CuK α rays (1.5418 Å)
β: Half-value width (°)
θ: Diffraction angle (°)
C: Constant=0.9

Volume Based Average Particle Size (D50) of Cerium Oxide Particles

The volume based average particle size (D50) of the cerium oxide particles was measured under the following conditions. Ion-exchanged water serving as a dispersion medium was injected into a measurement tank, and the polishing liquid composition was dropped into the dispersion medium while the dispersion medium was stirred and circulated. The polishing liquid composition was gradually added such that the laser beam transmittance of the mixed solution of the polishing liquid composition and the dispersion medium was 80 to 90%. Once the transmittance had reached the above-mentioned value, the particle size distribution was measured without performing ultrasonic dispersion treatment, and the volume based average particle size (D50) was determined.

Measurement apparatus: Laser diffraction/scattering particle size distribution analyzer LA-920 manufactured by HORIBA, Ltd.
Stirring speed: 4
Circulating speed: 4
Dispersion medium: Ion-exchanged water
Relative refractive index: 1.65

3. Evaluation of Polishing Liquid Compositions (Examples 1 to 29 and Comparative Examples 1 to 16)

Evaluation Sample

A silicon oxide film test piece was obtained by cutting a square piece with a size of 40 mm×40 mm from a silicon wafer provided with a silicon oxide film with a thickness of 2000 nm on one side thereof using a TEOS-plasma CVD method.

Polishing Conditions

Polishing testing machine: One-side polishing machine (TR15M-TRK1 manufactured by Techno Rise Corporation; surface plate diameter: 38 cm) Polishing Pad: Product No. IC-1000/Suba400 (manufactured by Nitta Haas Incorporated.)
Surface plate rotation number: 100 rpm
Head rotation number: 110 rpm (the rotation direction was the same as that of the surface plate)
Polishing load: 300 g-weight/cm$^2$
Supply amount of polishing liquid: 50 mL/min (3.125 g/(cm$^2$·min))
Polishing time: 1 minute Measurement of Silicon Oxide Film Polishing Speed The evaluation samples were polished under the above-mentioned polishing conditions using the polishing liquid composition shown in Table 1. After the polishing, the silicon oxide film test pieces were washed using ultrapure water and dried, and were used as measurement targets of measurement using an optical interferometric film thickness measurement apparatus, which will be described later. The polished evaluation samples were subjected to measurement of the thickness of a protruding remaining film using an optical interferometric film thickness measurement apparatus (product name: VM-1230; manufactured by SCREEN Semiconductor Solutions Co., Ltd.).

Before and after the polishing, the thickness of the silicon oxide film was measured using an optical interferometric film thickness measurement apparatus (product name: VM-1230; manufactured by SCREEN Semiconductor Solutions Co., Ltd.). The silicon oxide film polishing speed was calculated based on the equation below.

Silicon Oxide Film Polishing Speed (nm/minute)= [Thickness (nm) of silicon oxide film before polishing−thickness (nm) of silicon oxide film after polishing]/polishing time (minute)

Measurement of Silicon Nitride Film (Oxidation Stopper Film) Polishing Speed

Polishing of a silicon nitride film, measurement of the thickness thereof, and calculation of the polishing speed were performed in the same manner as in "Measurement of Silicon Oxide Film Polishing Speed" above, except that a silicon nitride film test piece was used as a test piece instead of the silicon oxide film test pieces, and the rotation time (polishing time) of the surface plate and a holder was set to 20 seconds. The silicon nitride film polishing speed was shown in Table 3 below.

Polishing Speed Ratio

The ratio of the silicon oxide film polishing speed to the silicon nitride film polishing speed was taken as a polishing speed ratio. The polishing speed ratio was calculated based on the equation below and is shown in Table 2 below. The greater the value of the polishing speed ratio is, the higher the polishing selectivity is.

Polishing speed ratio=silicon oxide film polishing speed (nm/minute)/silicon nitride film polishing speed (nm/minute)

TABLE 2

| Table 2 | Polishing liquid composition | | | | | | | Evaluation |
|---|---|---|---|---|---|---|---|---|
| | Cerium oxide particles | | Macromolecule X and comparison substance | | | | | Silicon oxide film polishing speed (nm/min) |
| | Type | Content (mass %) | Type | Type of constituent monomer | Polymerization ratio of constituent monomer | Weight average molecular weight | Content (mass %) | pH (25° C.) | |
| Comp. Ex. 1 | Pulverized ceria A | 0.3 | | | None | | | 6.5 | 162 |
| Ex. 1 | Pulverized ceria A | 0.3 | X1 | THMPA/MPC | 20/80 | 500,000 | 0.001 | 6.5 | 201 |
| Ex. 2 | Pulverized ceria A | 0.3 | | THMPA/MPC | 20/80 | 500,000 | 0.01 | 6.5 | 572 |
| Ex. 3 | Pulverized ceria A | 0.3 | | THMPA/MPC | 20/80 | 500,000 | 0.1 | 6.5 | 253 |
| Ex. 4 | Pulverized ceria A | 0.3 | | THMPA/MPC | 20/80 | 500,000 | 0.5 | 6.5 | 187 |
| Ex. 5 | Pulverized ceria A | 0.3 | X2 | THMPA/MPC | 5/95 | 300,000 | 0.01 | 6.5 | 524 |
| Ex. 6 | Pulverized ceria A | 0.3 | X3 | THMPA/MPC | 50/50 | 520,000 | 0.01 | 6.5 | 411 |
| Ex. 7 | Pulverized ceria A | 0.3 | X4 | THMPA/MPC | 80/20 | 150,000 | 0.01 | 6.5 | 243 |
| Ex. 8 | Pulverized ceria A | 0.3 | X5 | THMPA/CBMA | 20/80 | 310,000 | 0.01 | 6.5 | 361 |
| Ex. 9 | Pulverized ceria A | 0.3 | X6 | THMPA/SBMA | 20/80 | 460,000 | 0.01 | 6.5 | 250 |
| Ex. 10 | Pulverized ceria A | 0.3 | X7 | MOEA/MPC | 20/80 | 330,000 | 0.01 | 6.5 | 428 |
| Ex. 11 | Pulverized ceria A | 0.3 | X8 | MOEDEA/MPC | 20/80 | 250,000 | 0.01 | 6.5 | 455 |
| Comp. Ex. 2 | HC-60 | 0.3 | | | None | | | 6.5 | 291 |
| Ex. 12 | HC-60 | 0.3 | X1 | THMPA/MPC | 20/80 | 500,000 | 0.01 | 6.5 | 412 |
| Comp. Ex. 3 | Pulverized ceria A | 0.3 | X11 | CBMA monomer | — | — | 0.05 | 5.1 | 165 |
| Comp. Ex. 4 | Pulverized ceria A | 0.3 | X12 | CBMA homopolymer | 0/100 | 360,000 | 0.05 | 5.1 | 163 |
| Comp. Ex. 5 | Pulverized ceria A | 0.3 | X13 | SBMA homopolymer | 0/100 | 440,000 | 0.01 | 6.5 | 157 |
| Comp. Ex. 6 | Pulverized ceria A | 0.3 | X14 | Betaine | — | — | 0.01 | 6.5 | 169 |
| Comp. Ex. 7 | Pulverized ceria A | 0.3 | X15+ X12[1)] | Mixture of THMPA homopolymer and CBMA homopolymer | — | — | 0.01 | 6.5 | 131 |
| Comp. Ex. 8 | Pulverized ceria A | 0.3 | X16 | Copolymer of monomer containing anionic group and monomer containing cationic group | — | 280,000 | 0.01 | 6.5 | 164 |

[1)]The mixing ratio (mass ratio) between X15 and X12 was 2:8.

As shown in Table 2, the silicon oxide film polishing speed was faster in the case where the polishing liquid compositions of Examples 1 to 12 were used than in the case where the polishing liquid compositions of Comparative Examples 1 to 8 were used.

TABLE 3

| Table 3 | Polishing liquid composition | | | | | | | | | Evaluation | | |
|---|---|---|---|---|---|---|---|---|---|---|---|---|
| | Ceria particles | | Macromolecule X or comparison substance | | | | | Macromolecule Y | | Silicon oxide film | Silicon nitride film | |
| | Type | Content (mass %) | Type | Type of constituent monomer | Ratio | Weight average molecular weight | Content (mass %) | Type | Content (mass %) | pH (25° C.) | polishing speed (nm/min) | polishing speed (nm/min) | Polishing selective ratio |
| Comp. Ex. 1 | Pulverized ceria A | 0.3 | | None | | | | None | | 6.5 | 162 | 65 | 2.5 |
| Comp. Ex. 9 | Pulverized ceria A | 0.3 | | None | | | | PAA | 0.4 | 6.5 | 143 | 9.3 | 15.2 |
| Ex. 13 | Pulverized ceria A | 0.3 | X9 | MPC homo-polymer | — | 100,000 | 0.01 | None | | 6.5 | 189 | 61.3 | 3.1 |
| Ex. 14 | Pulverized ceria A | 0.3 | | MPC homo polymer- | — | 100,000 | 0.01 | PAA | 0.4 | 6.5 | 181 | 9 | 20.1 |
| Ex. 2 | Pulverized ceria A | 0.3 | X1 | THMPA/MPC | 20/80 | 500,000 | 0.01 | None | | 6.5 | 572 | 144 | 4.0 |
| Ex. 15 | Pulverized ceria A | 0.3 | | THMPA/MPC | 20/80 | 500,000 | 0.01 | PAA | 0.4 | 6.5 | 740 | 11.2 | 66.1 |
| Ex. 16 | Pulverized ceria A | 0.3 | | THMPA/MPC | 20/80 | 500,000 | 0.001 | PAA | 0.4 | 6.5 | 194 | 9.6 | 20.2 |
| Ex. 17 | Pulverized ceria A | 0.3 | | THMPA/MPC | 20/80 | 500,000 | 0.1 | PAA | 0.4 | 6.5 | 312 | 14.3 | 21.8 |
| Ex. 18 | Pulverized ceria A | 0.3 | X2 | THMPA/MPC | 5/95 | 300,000 | 0.01 | PAA | 0.4 | 6.5 | 702 | 12.3 | 57.0 |
| Ex. 19 | Pulverized ceria A | 0.3 | X3 | THMPA/MPC | 50/50 | 520,000 | 0.01 | PAA | 0.4 | 6.5 | 534 | 10.1 | 52.9 |
| Ex. 20 | Pulverized ceria A | 0.3 | X4 | THMPA/MPC | 80/20 | 150,000 | 0.01 | PAA | 0.4 | 6.5 | 277 | 13.1 | 21.1 |
| Ex. 21 | Pulverized ceria A | 0.3 | X7 | MOEA/MPC | 20/80 | 330,000 | 0.01 | PAA | 0.4 | 6.5 | 592 | 10.4 | 56.9 |
| Ex. 22 | Pulverized ceria A | 0.3 | X8 | MOEDEA/MPC | 20/80 | 250,000 | 0.01 | PAA | 0.4 | 6.5 | 640 | 10.9 | 58.7 |
| Ex. 23 | Pulverized ceria A | 0.3 | X1 | THMPA/MPC | 20/80 | 500,000 | 0.01 | PAA | 0.01 | 6.5 | 611 | 22.3 | 27.4 |
| Ex. 24 | Pulverized ceria A | 0.3 | | THMPA/MPC | 20/80 | 500,000 | 0.01 | PAA | 0.1 | 6.5 | 629 | 12.8 | 49.1 |
| Ex. 25 | Pulverized ceria A | 0.3 | | THMPA/MPC | 20/80 | 500,000 | 0.01 | PAA | 0.7 | 6.5 | 195 | 8.2 | 23.8 |
| Ex. 26 | Pulverized ceria A | 0.3 | | THMPA/MPC | 20/80 | 500,000 | 0.01 | Polyvinyl phosphonic acid | 0.4 | 6.5 | 688 | 10.3 | 66.8 |
| Ex. 27 | Pulverized ceria A | 0.3 | | THMPA/MPC | 20/80 | 500,000 | 0.01 | Polyvinyl phosphonic acid | 0.4 | 6.5 | 266 | 12.5 | 21.3 |
| Ex. 28 | Pulverized ceria A | 0.3 | | THMPA/MPC | 20/80 | 500,000 | 0.01 | P(AA/AMPS) | 0.4 | 6.5 | 735 | 9.9 | 74.2 |
| Comp. Ex. 10 | HC-60 | 0.3 | | None | | | | None | | 6.5 | 291 | 170 | 1.7 |
| Comp. Ex. 11 | HC-60 | 0.3 | | None | | | | PAA | 0.4 | 6.5 | 63 | 4.8 | 13.1 |
| Ex. 12 | HC-60 | 0.3 | X1 | THMPA/MPC | 20/80 | 500,000 | 0.01 | None | | 6.5 | 412 | 215 | 1.9 |
| Ex. 29 | HC-60 | 0.3 | | THMPA/MPC | 20/80 | 500,000 | 0.01 | PAA | 0.4 | 6.5 | 373 | 6.5 | 57.4 |
| Comp. Ex. 12 | Pulverized ceria A | 0.3 | X11 | CBMA monomer | — | — | 0.01 | PAA | 0.4 | 5.1 | 87 | 8.4 | 10.4 |
| Comp. Ex. 13 | Pulverized ceria A | 0.3 | X12 | CBMA homo-polymer | — | 360,000 | 0.01 | PAA | 0.4 | 5.1 | 79 | 9.2 | 8.6 |
| Comp. Ex. 14 | Pulverized ceria A | 0.3 | X13 | SBMA homo-polymer | — | 440,000 | 0.01 | PAA | 0.4 | 6.5 | 142 | 10.3 | 13.8 |

TABLE 3-continued

| Table 3 | Ceria particles | | Macromolecule X or comparison substance | | | | | Macromolecule Y | | pH (25° C.) | Evaluation | | |
|---|---|---|---|---|---|---|---|---|---|---|---|---|---|
| | Type | Content (mass %) | Type | Type of constituent monomer | Ratio | Weight average molecular weight | Content (mass %) | Type | Content (mass %) | | Silicon oxide film polishing speed (nm/min) | Silicon nitride film polishing speed (nm/min) | Polishing selective ratio |
| Comp. Ex. 15 | Pulverized ceria A | 0.3 | X14 | Betaine | — | — | 0.01 | PAA | 0.4 | 6.5 | 138 | 9.3 | 14.8 |
| Comp. Ex. 16 | Pulverized ceria A | 0.3 | X16 | THMPA/ MAA | 50/50 | 280.000 | 0.01 | PAA | 0.4 | 6.5 | 131 | 11.3 | 11.6 |

As shown in Table 3, in the case where the polishing liquid compositions of Examples 13 to 29 containing both the macromolecule X and the macromolecule Y were used, the polishing of the silicon nitride film is inhibited while the silicon oxide film is polished at a high speed, and thus high polishing selectivity can be realized.

INDUSTRIAL APPLICABILITY

As described above, the polishing liquid composition according to the present disclosure is useful in a method for manufacturing a semiconductor device capable of realizing high density and high integration degree.

The invention claimed is:

1. A polishing liquid composition for a silicon oxide film, comprising:
cerium oxide particles;
a water-soluble macromolecular compound; and
an aqueous medium,
wherein the weight average molecular weight of the water-soluble macromolecular compound is 10,000 or more and 1,000,000 or less,
wherein the water-soluble macromolecular compound is a water-soluble macromolecular compound including a betaine structure, excluding carbobetaine homopolymers and sulfobetaine homopolymers, and
wherein the water-soluble macromolecular compound is a homopolymer or a copolymer containing a constitutional unit A represented by Formula (1):

Chemical Formula 1

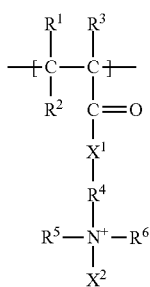

(1)

where
$R^1$ to $R^3$ are the same as or different from each other and represent a hydrogen atom, a methyl group, or an ethyl group,
$R^4$ represents $-Y^1-OPO_3^--Y^2-$,
$Y^1$ and $Y^2$ are the same as or different from each other and represent an alkylene group having 1 to 4 carbon atoms,
$R^5$ and $R^6$ are the same as or different from each other and represent a hydrocarbon group having 1 to 4 carbon atoms,
$X^1$ represents O or $NR^7$,
$R^7$ represents a hydrogen atom or a hydrocarbon group having 1 to 4 carbon atoms, and
$X^2$ represents a hydrocarbon group having 1 to 4 carbon atoms.

2. The polishing liquid composition for a silicon oxide film according to claim 1, wherein the water-soluble macromolecular compound is a water-soluble macromolecular compound including a phosphobetaine structure.

3. The polishing liquid composition for a silicon oxide film according to claim 1, wherein the content of the cerium oxide particles contained in the polishing liquid composition is 0.01 mass % or more and 10 mass % or less, and
the content of the water-soluble macromolecular compound in the polishing liquid composition is 0.0005 mass % or more and 1.0 mass % or less.

4. The polishing liquid composition for a silicon oxide film according to claim 1, wherein the pH of the polishing liquid composition is 2.5 or higher and 9.5 or lower.

5. The polishing liquid composition for a silicon oxide film according to claim 1, further comprising an anionic macromolecular compound.

6. The polishing liquid composition for a silicon oxide film according to claim 1, wherein the water-soluble macromolecular compound is a water-soluble macromolecular compound containing a constitutional unit A including a betaine structure, and a constitutional unit B that is a constitutional unit other than the constitutional unit A and contains at least one group of a primary amino group, a secondary amino group, a tertiary amino group, a quaternary ammonium group, and salts thereof.

7. The polishing liquid composition for a silicon oxide film according to claim 6, wherein the water-soluble macromolecular compound is a water-soluble macromolecular compound containing a constitutional unit b represented by Formula (2):

Chemical Formula 2

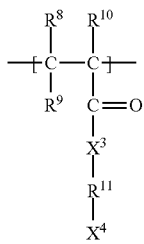

(2)

where $R^8$ to $R^{10}$ are the same as or different from each other and represent a hydrogen atom, a methyl group, or an ethyl group, $X^3$ represents O or $NR^{19}$, $R^{19}$ represents a hydrogen atom or a hydrocarbon group having 1 to 4 carbon atoms, $R^{11}$ represents an alkylene group having 1 to 22 carbon atoms, where a hydrogen atom of the alkylene group is optionally substituted by a hydroxy group, $X^4$ represents $N^+R^{12}R^{13}R^{14}$ or $NR^{51}R^{16}$, $R^{12}$ to $R^{14}$ are the same as or different from each other and represent a hydrocarbon group having 1 to 4 carbon atoms, and $R^{15}$ and $R^{16}$ are the same as or different from each other and represent a hydrogen atom or a hydrocarbon group having 1 to 4 carbon atoms.

8. The polishing liquid composition for a silicon oxide film according to claim 1, wherein the water-soluble macromolecular compound is a copolymer that further contains a constitutional unit B represented by Formula (2):

Chemical Formula 2

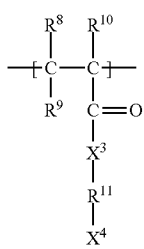

(2)

where $R^8$ to $R^{10}$ are the same as or different from each other and represent a hydrogen atom, a methyl group, or an ethyl group, $X^3$ represents O or $NR^{19}$, $R^{19}$ represents a hydrogen atom or a hydrocarbon group having 1 to 4 carbon atoms, $R^{11}$ represents an alkylene group having 1 to 22 carbon atoms, where a hydrogen atom of the alkylene group is optionally substituted by a hydroxy group, $X^4$ represents $N*R^{12}R^{13}R^{14}$ or $NR^{15}R^{16}$, $R^{12}$ to $R^{14}$ are the same as or different from each other and represent a hydrocarbon group having 1 to 4 carbon atoms, and $R^{15}$ and $R^{16}$ are the same as or different from each other and represent a hydrogen atom or a hydrocarbon group having 1 to 4 carbon atoms.

9. The polishing liquid composition for a silicon oxide film according to claim 8, wherein the molar ratio between the constitutional unit B and the constitutional unit A (constitutional unit B/constitutional unit A) in the water-soluble macromolecular compound is and 5/95 or more and 90/10 or less.

10. A method for manufacturing a semiconductor device, comprising a step of polishing a silicon oxide film using the polishing liquid composition for a silicon oxide film according to claim 1.

11. A method for polishing a silicon oxide film, comprising a step of polishing a silicon oxide film using the polishing liquid composition for a silicon oxide film according to claim 1, wherein the silicon oxide film is an insulating film formed in a process for manufacturing a semiconductor device.

12. A polishing liquid kit for preparing a polishing liquid composition for a silicon oxide film, comprising:

a first liquid obtained by dispersing cerium oxide particles in an aqueous medium; and a second liquid that is contained in a container separate from a container containing the first liquid and contains an aqueous medium, wherein one or both of the first liquid and the second liquid further contains a water-soluble macromolecular compound, wherein the weight average molecular weight of the water-soluble macromolecular compound is 10,000 or more and 1,000,000 or less, the water-soluble macromolecular compound is a water-soluble macromolecular compound including a betaine structure, excluding carbobetaine homopolymers and sulfobetaine homopolymers, and wherein the water-soluble macromolecular compound is a homopolymer or a copolymer containing a constitutional unit A represented by Formula (1):

Chemical Formula 1

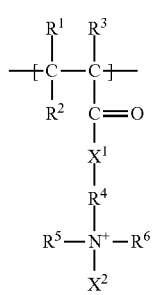

(1)

where $R^1$ to $R^3$ are the same as or different from each other and represent a hydrogen atom, a methyl group, or an ethyl group, $R^4$ represents —$Y^1$—$OPO_3^-$—$Y^2$—, $Y^1$ and $Y^2$ are the same as or different from each other and represent an alkylene group having 1 to 4 carbon atoms, $R^5$ and $R^6$ are the same as or different from each other and represent a hydrocarbon group having 1 to 4 carbon atoms, $X^1$ represents O or $NR^7$, $R^7$ represents a hydrogen atom or a hydrocarbon group having 1 to 4 carbon atoms, $X^2$ represents a hydrocarbon group having 1 to 4 carbon atoms.

13. The polishing liquid kit according to claim 12, wherein one or both of the first liquid and the second liquid further contains an anionic macromolecular compound.

14. An additive composition for silicon oxide film polishing to be used together with a dispersion liquid obtained by dispersing cerium oxide particles in an aqueous medium, comprising:

an aqueous medium; and a water-soluble macromolecular compound dissolved in the aqueous medium, wherein the weight average molecular weight of the water-soluble macromolecular compound is 10,000 or more and 1,000,000 or less, wherein the water-soluble macromolecular compound is a water-soluble macromolecular compound including a betaine structure, excluding carbobetaine homopolymers and sulfobetaine homopolymers, and wherein the water-soluble macromolecular compound is a homopolymer or a copolymer containing a constitutional unit A represented by Formula (1):

Chemical Formula 1

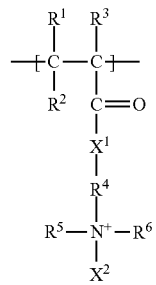

(1)

where $R^1$ to $R^3$ are the same as or different from each other and represent a hydrogen atom, a methyl group, or an ethyl group, $R^4$ represents —$Y^1$—$OPO_3^-$—$Y^2$—, $Y^1$ and $Y^2$ are the same as or different from each other and represent an alkylene group having 1 to 4 carbon atoms, $R^5$ and $R^6$ are the same as or different from each other and represent a hydrocarbon group having 1 to 4 carbon atoms, $X^1$ represents O or $NR^7$, $R^7$ represents a hydrogen atom or a hydrocarbon group having 1 to 4 carbon atoms, $X^2$ represents a hydrocarbon group having 1 to 4 carbon atoms.

15. The additive composition according to claim 14, further comprising an anionic macromolecular compound.

\* \* \* \* \*